(12) United States Patent
Ramachandran et al.

(10) Patent No.: US 8,269,333 B2
(45) Date of Patent: Sep. 18, 2012

(54) COMBINED POWER MESH TRANSITION AND SIGNAL OVERPASS/UNDERPASS

(75) Inventors: Aparna Ramachandran, Sunnyvale, CA (US); Robert P. Masleid, Monte Sereno, CA (US)

(73) Assignee: Oracle America, Inc., Redwood City, CA (US)

( * ) Notice: Subject to any disclaimer, the term of this patent is extended or adjusted under 35 U.S.C. 154(b) by 345 days.

(21) Appl. No.: 12/646,806

(22) Filed: Dec. 23, 2009

(65) Prior Publication Data

US 2011/0147915 A1 Jun. 23, 2011

(51) Int. Cl.
*H01L 23/535* (2006.01)
*H01L 23/528* (2006.01)

(52) U.S. Cl. ........ 257/691; 257/690; 257/750; 257/773; 257/776; 257/786; 257/E23.153; 257/E23.168

(58) Field of Classification Search .................. 257/690, 257/691, 750, 773, 776, 786, E23.153, E23.168
See application file for complete search history.

(56) References Cited

U.S. PATENT DOCUMENTS

2001/0047588 A1* 12/2001 Schaper .......................... 29/847

* cited by examiner

*Primary Examiner* — Peniel M Gumedzoe
(74) *Attorney, Agent, or Firm* — Osha Liang LLP

(57) ABSTRACT

A zipper structure includes a first contiguous full-dense-mesh (FDM) array of a first circuit in top metal and a second contiguous FDM array of a second circuit in top-1 metal, a third contiguous FDM array of the second circuit in top metal and a fourth contiguous FDM array of the first circuit in top-1 metal, and a signal line, such that portions of the first contiguous FDM array and the second contiguous FDM array overlap and portions of the third contiguous FDM array and the fourth contiguous FDM array overlap. The Zipper structure facilitates connecting the first contiguous FDM array to the fourth contiguous FDM array by vias and a first connector lines and the second contiguous FDM array to the third contiguous FDM array by vias and a second connector lines, such that portion of the signal line overlaps with the first connector lines and the second connector lines.

20 Claims, 12 Drawing Sheets

COMBINED POWER MESH TRANSITION AND SIGNAL OVERPASS/UNDERPASS

BACKGROUND OF INVENTION

1. Field of the Invention

The invention relates generally to power distribution in a semiconductor device.

2. Related Art

A break point (or, a jumper) in power mesh may be encountered to allow a signal line to run across power mesh without a break, when the power mesh and the signal line are in the same layer of metal. Similarly, a break point in the power mesh may also be encountered in case of a bump pad and a power mesh of alternate supply, e.g. in case of a VSS bump pad and a VDD power mesh. The use of VIAs in such break points contributes to an increased power mesh resistance, with VIA resistance playing a significant role. An increased power mesh resistance, in turn, causes degradation of the frequency of operation and of the active power of a semiconductor device. As supply voltages in semiconductor devices are scaled down, it becomes even more important to improve power distribution.

SUMMARY OF INVENTION

In one or more embodiments, the present invention relates to a zipper structure, comprising: a first contiguous full-dense-mesh (FDM) array of a first supply in a top metal layer of a plurality of metal layers; a second contiguous FDM array of a second supply in a top-1 metal layer of the plurality of metal layers, wherein a portion of the first contiguous FDM array and a portion of the second contiguous FDM array overlap; a third contiguous FDM array of the second supply in the top metal layer; a fourth contiguous FDM array of the first supply in the top-1 metal layer, wherein a portion of the third contiguous FDM array and a portion of the fourth contiguous FDM array overlap; and a signal line, wherein the first contiguous FDM array is connected to the fourth contiguous FDM array by a first plurality of VIAs and a first plurality of connector lines, wherein the second contiguous FDM array is connected to the third contiguous FDM array by a second plurality of VIAs and a second plurality of connector lines, and wherein a portion of the signal line overlaps with a portion of the first plurality of connector lines and with a portion of the second plurality of connector lines.

In one or more embodiments, the present invention relates to a semiconductor device comprising: a mechanical package; and a semiconductor die comprising: a semiconductor layer, a plurality of metal layers, and a zipper structure comprising: a first contiguous full-dense-mesh (FDM) array of a first supply in a top metal layer of the plurality of metal layers; a second contiguous FDM array of a second supply in a top-1 metal layer of the plurality of metal layers, wherein a portion of the first contiguous FDM array and a portion of the second contiguous FDM array overlap; a third contiguous FDM array of the second supply in the top metal layer; a fourth contiguous FDM array of the first supply in the top-1 metal layer, wherein a portion of the third contiguous FDM array and a portion of the fourth contiguous FDM array overlap; and a signal line, wherein the first contiguous FDM array is connected to the fourth contiguous FDM array by a first plurality of VIAs and a first plurality of connector lines, wherein the second contiguous FDM array is connected to the third contiguous FDM array by a second plurality of VIAs and a second plurality of connector lines, and wherein a portion of the signal line overlaps with a portion of the first plurality of connector lines and with a portion of the second plurality of connector lines.

In one or more embodiments, the present invention relates to a system comprising: an input device; an output device; a mechanical chassis; a printed circuit board; and a semiconductor device comprising: a mechanical package, and a semiconductor die comprising: a semiconductor layer, a plurality of metal layers, and a zipper structure comprising: a first contiguous full-dense-mesh (FDM) array of a first supply in a top metal layer of the plurality of metal layers; a second contiguous FDM array of a second supply in a top-1 metal layer of the plurality of metal layers, wherein a portion of the first contiguous FDM array and a portion of the second contiguous FDM array overlap; a third contiguous FDM array of the second supply in the top metal layer; a fourth contiguous FDM array of the first supply in the top-1 metal layer, wherein a portion of the third contiguous FDM array and a portion of the fourth contiguous FDM array overlap; and a signal line, wherein the first contiguous FDM array is connected to the fourth contiguous FDM array by a first plurality of VIAs and a first plurality of connector lines, wherein the second contiguous FDM array is connected to the third contiguous FDM array by a second plurality of VIAs and a second plurality of connector lines, and wherein a portion of the signal line overlaps with a portion of the first plurality of connector lines and with a portion of the second plurality of connector lines.

Other aspects and advantages of the invention will be apparent from the following description and the appended claims.

DETAILED DESCRIPTION

Figure 1A:
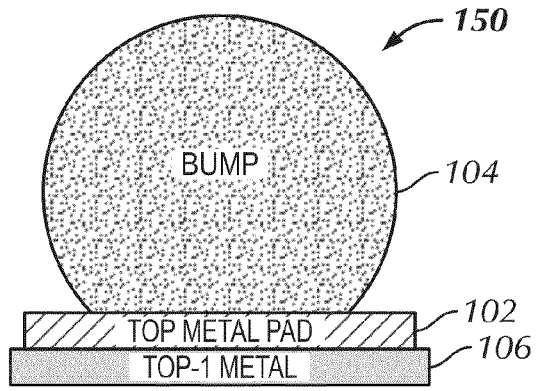
FIGS. 1(a) and 1(b) show the cross sections of pad and bump structure based upon the prior art.

Specific embodiments of the present invention will now be described in detail with reference to the accompanying figures. Like elements in the various figures are denoted by like reference numerals for consistency. Further, in the following detailed description of embodiments of the present invention, numerous specific details are set forth in order to provide a more thorough understanding of the present invention. In other instances, well-known features have not been described in detail to avoid obscuring the description of embodiments of the present invention.

FIG. 1(a) shows the cross section 150 of pad and bump structure based upon the prior art. The two top metal layers, top metal 102 and top-1 metal 106, are shown in the cross section 150. The top-1 metal refers to a very next metal layer below the top metal. It is common in the prior art to have VDD power bus in one layer of metal, e.g. top metal, and VSS power bus in another layer of metal, e.g., top-1 metal. The top metal 102 and the top-1 metal 106 have a direct contact in the cross sections 150. The top metal 102 constitutes a pad which is connected to a bump 104.

The cross section 150 illustrates a VDD pad and bump structure. In the example of VDD pad and bump structure, it is obvious from the cross section 150 that VSS power bus would have a discontinuity at the VDD pad and bump structure. The direct contact of top metal 102 and top-1 metal 106 prohibits a VSS power bus in the top-1 metal layer directly below the VDD pad and bump structure.

Figure 1B:
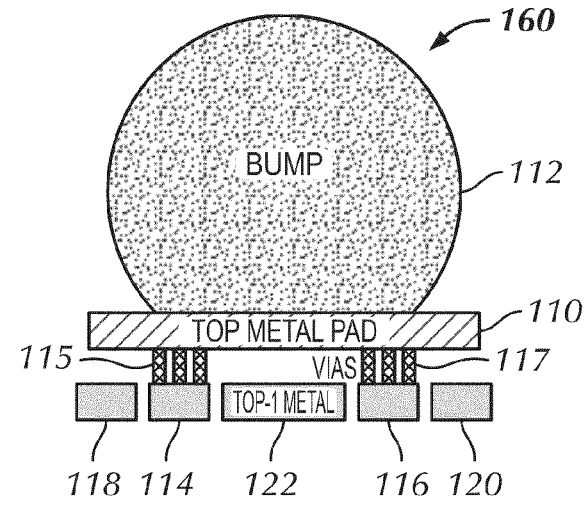

FIG. 1(b) shows the cross section 160 for another configuration of the pad and bump structure. In the cross section 160, the top metal 110 and top-1 metal 114 and 116 are joined together by VIAs such as 115 and 117. The top metal 110 constitutes a pad which is connected to a bump 112. The cross section 160 illustrates a VDD pad and bump structure. In this example of VDD pad and bump structure, it is obvious from the cross section 160 that VSS power bus can be in top-1 metal 118, 120, and 122 directly below the VDD pad and bump structure.

Figure 2A:
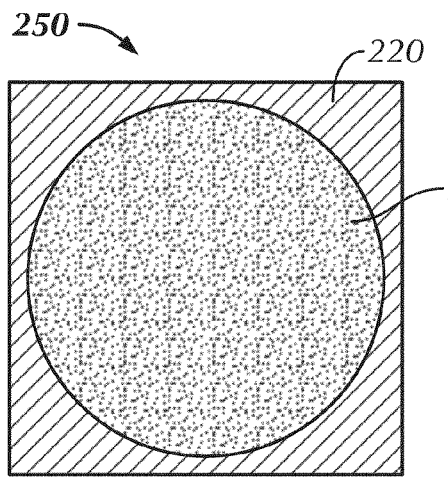
FIGS. 2(a), 2(b), and 2(c) show the layouts of pad and bump structure based upon the prior art.
Figure 2B:
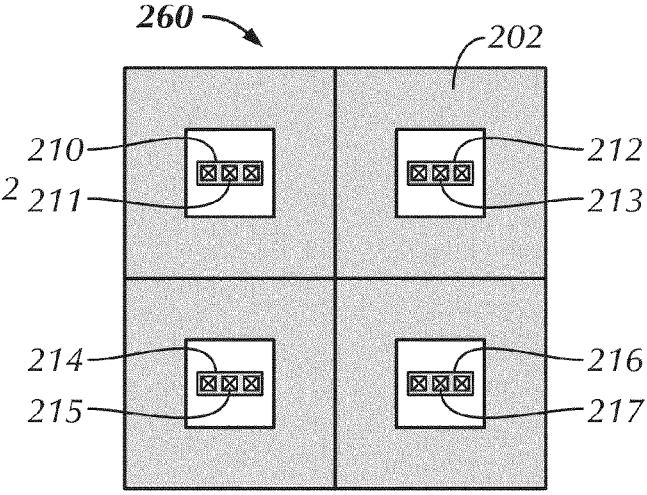
Figure 2C:
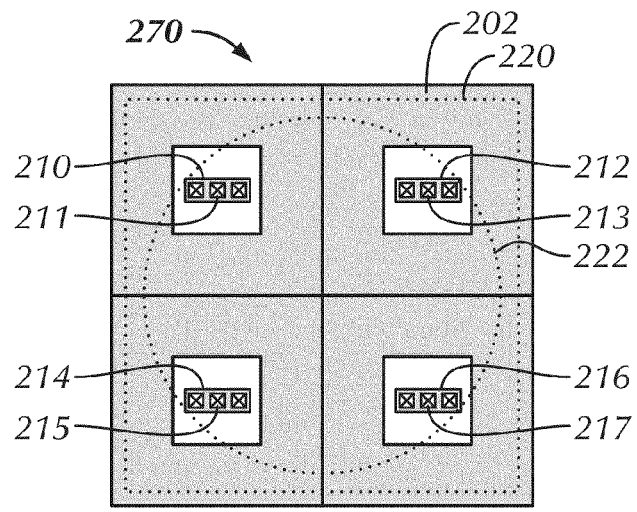

FIGS. 2(a), 2(b) and 2(c) show the layouts of pad and bump structure based upon the cross section 160 in FIG. 1(b). FIG. 2(a) shows layout 250 for the top metal 220 and bump structure 222. FIG. 2(b) shows layout 260 for the top-1 metal structures 202, 210, 212, 214, and 216. The top-1 metal 202 is a square metal structure with four square holes. There is also a top-1 metal structure in each of the four square holes, top-1 metal 210 connected to top metal 220 by VIA 211, top-1 metal 212 connected to top metal 220 by VIA 213, top-1 metal 214 connected to top metal 220 by VIA 215, and top-1 metal 216 connected to top metal 220 by VIA 217.

Based upon the example described in cross section 160 of FIG. 1(b), layout 250 in FIG. 2(a) illustrates a VDD pad and bump structure. The top metal 220 constitutes a pad which is connected to a bump 222. The VDD top metal 220 in FIG. 2(a) is connected in FIG. 2(b) to four VDD top-1 metal structures 210, 212, 214, and 216 with corresponding VIAs 211, 213, 215, and 217. In this example, the top-1 metal 202 can be a VSS power bus, directly below the VDD pad and bump structure of FIG. 2(a), as shown.

The layout 270 in FIG. 2(c) is created by placing layout 250 directly above the layout 260. The layout 270 provides an X-ray view, e.g. see-through view, of top-1 metal layer of layout 260 with top metal of layout 250 placed directly above. Only the boundary lines are shown for top metal and bump of layout 250 so as not to obscure the view of top-1 metal of layout 260. Based upon the example discussed above, the layout 270 illustrates VDD top metal 220 directly above VSS top-1 metal 202. There is no discontinuity in VSS power bus at the VDD pad and bump.

Figure 3:
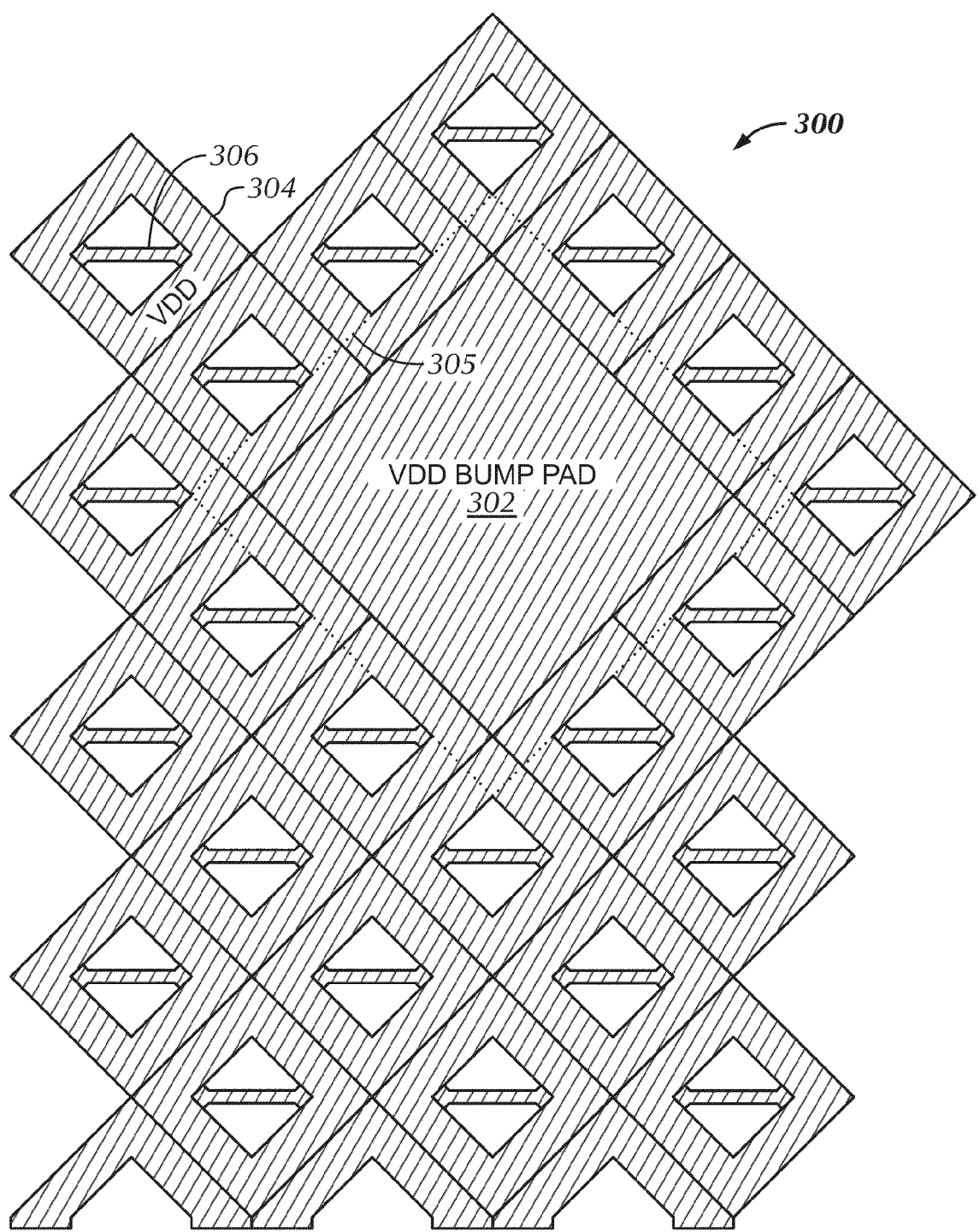
FIG. 3 shows the layout of pad and mesh structure based upon the prior art.

FIG. 3 shows a layout 300 of pad and mesh structure, in top metal layer. In this example, the VDD power bus is in the top metal layer and the VSS power bus is in the top-1 metal layer. The layout 300 illustrates recessed-square structure 304 and diagonal structure 306, replicated multiple times to create a VDD top metal mesh as shown. The VDD bump pad 302, i.e., the VDD pad and bump structure, consists of the VDD pad 305 in top metal (the bump is not shown). The boundary of VDD pad 305 seamlessly integrates with the replicated VDD mesh. The VSS power bus may be directly below in top-1 metal (not shown) as already discussed earlier. Here, the VDD bump pad 302 does not create break points in the replicated VDD mesh.

Figure 4A:
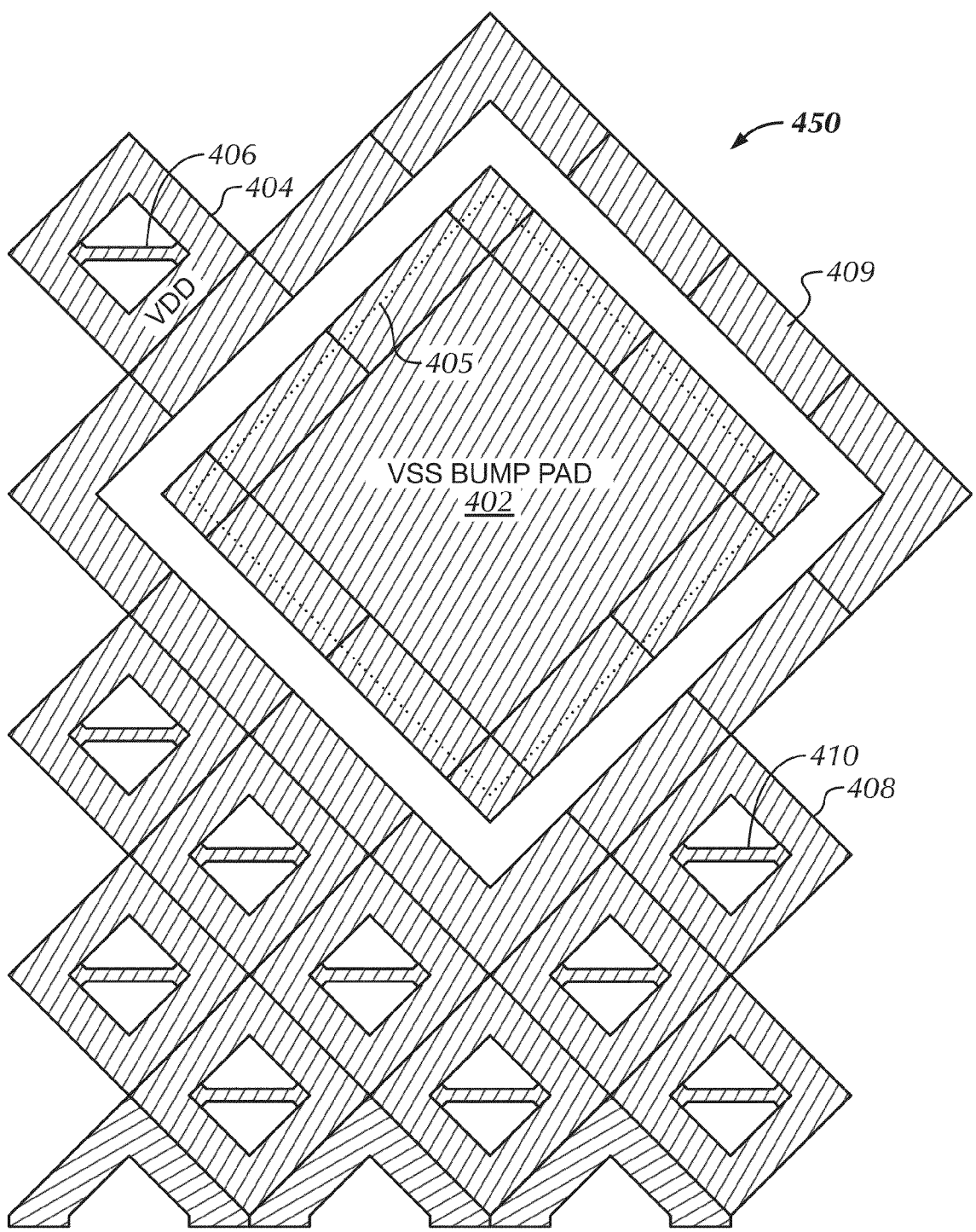
FIGS. 4(a), 4(b), and 4(c) show the layouts of pad and mesh structure based upon the prior art.

FIG. 4(a) shows the layout 450 of pad and mesh structure, in top metal layer, based upon the prior art. The following discussion is based upon an example of the VDD power bus in the top metal layer and the VSS power bus in the top-1 metal layer. The layout 450 illustrates a VSS bump pad 402, i.e., the VSS pad and bump structure, consisting of the VSS pad 405 in top metal (the bump is not shown). The VSS pad 405 is surrounded by a VDD top metal ring 409 connected to a VDD top metal mesh. The layout 450 illustrates recessed-square structure 404 and diagonal structure 406, replicated multiple times to create a VDD top metal mesh as shown.

Figure 4B:
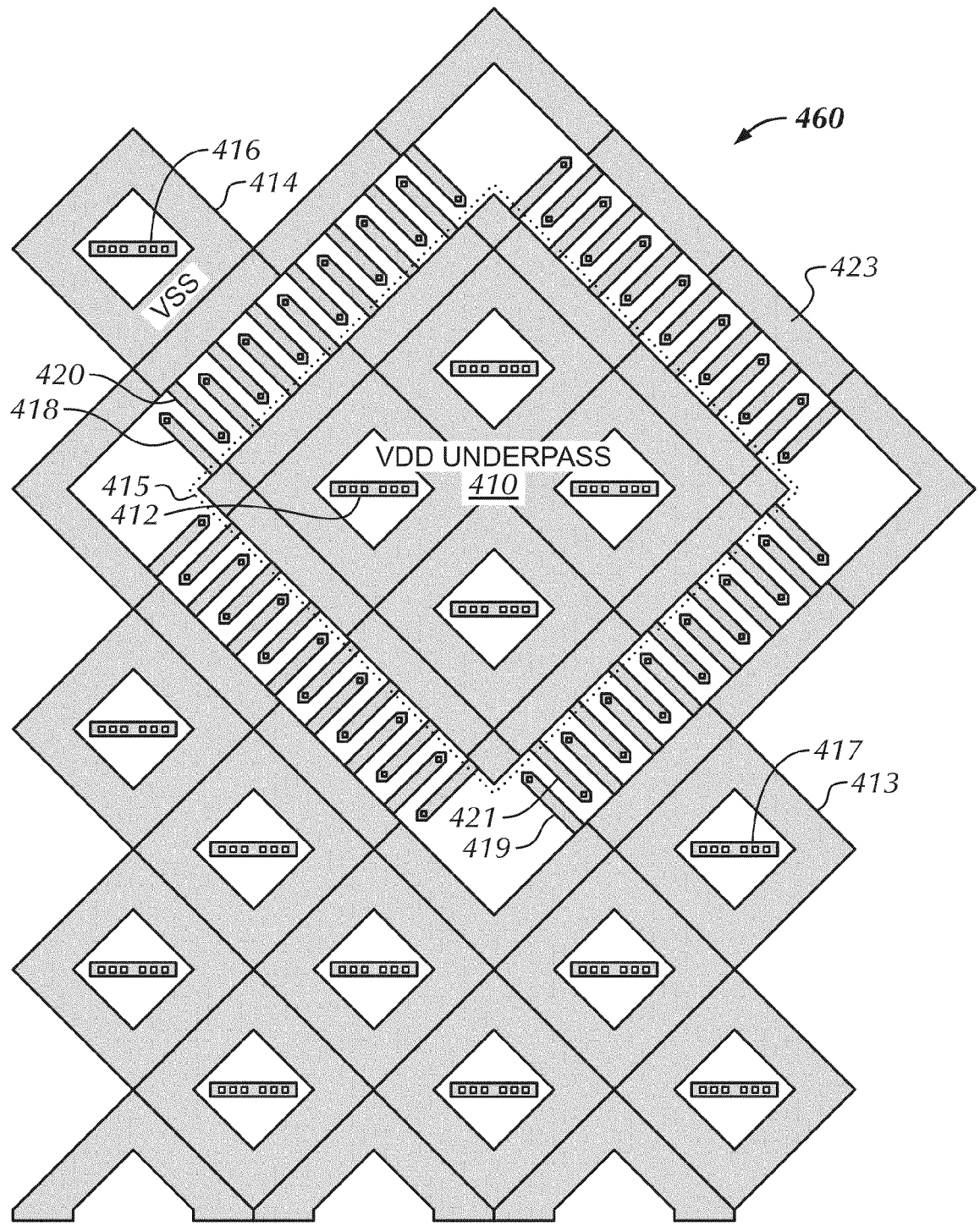

FIG. 4(b) shows the layout 460 of pad and mesh structure, in top-1 metal layer, based upon the prior art. The layout 460 illustrates recessed-square structure 414 and diagonal structure 416, replicated multiple times to create a VSS top-1 metal mesh connected to top-1 metal ring 423 as shown. The top-1 metal ring 423 is connected to the VSS top metal pad 405 in layout 450 by connectors such as 420. The connector 420, including a top-1 metal connector line and a VIA, provides connection from the VSS top metal pad 405 in layout 450 to the top-1 metal connector line through the VIA. This way, the VSS top-1 metal mesh is connected to the VSS top metal pad 405 in layout 450.

The layout 460 also shows VDD top-1 metal underpass 410 directly below the VSS top metal pad 405 in layout 450. The VDD top-1 metal underpass 410 is connected to the VDD top metal ring 409 in layout 450 by connectors such as 418. The connector 418, including a top-1 metal connector line and a VIA, provides connection from the VDD top metal ring 409 in layout 450 to the top-1 metal connector line through the VIA. This way, the VDD top-1 metal underpass 410 is connected to VDD top metal mesh. Furthermore, the VSS top-1 metal structures such as 412 are connected to VSS top metal pad 405 in layout 450 through VIAs shown (not numbered) on top-1 metal structure 412.

Figure 4C:
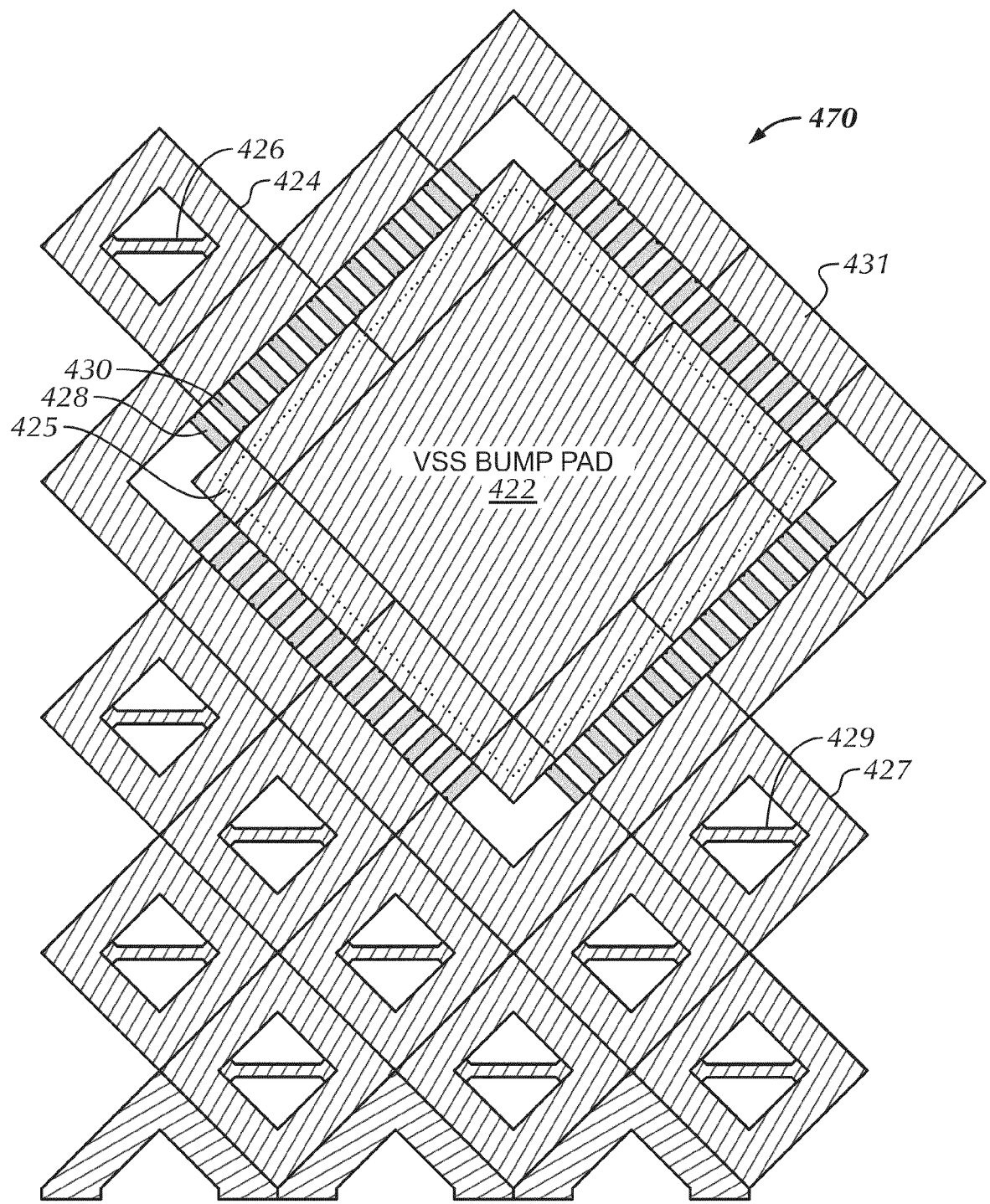

FIG. 4(c) shows the layout 470 of a pad and mesh structure, created by placing top metal layout 450 directly above the top-1 metal layout 460, based upon the prior art. The VSS bump pad 422 creates a break point (i.e., discontinuity), other than a narrow top metal ring 431, between a VDD top metal mesh created by replicating structures 424/426 and another VDD top metal mesh created by replicating structures 427/429.

However, in the example of a signal line running in top metal in the north-east direction (not shown), there would be a complete discontinuity, because there would not be a top metal ring (without break) in the example of the signal line. It will be apparent to those skilled in that art that it is not possible to have a top metal ring (without break) with a signal line running in top metal layer. In either scenario, though, there is another connectivity provided between the two VDD top metal meshes through connectors (i.e., top-1 metal connector lines and VIAs). While the connectors are able to provide continuity between the two meshes, it will be apparent to those skilled in the art based upon the earlier discussion that such connectivity is associated with two VIAs. In the discussion here, one VIA may refer to one VIA and/or one group of similar VIAs, and two VIAs may refer to two VIAs and/or two groups of similar VIAs.

Continuing with layouts 450 and 460, one of the VDD top metal meshes is connected to top-1 metal connector line by a VIA (e.g. connector 418), and top-1 metal connector line in connector 418 is further connected to top-1 metal connector line in connector 421 by VDD top-1 metal underpass 410. The other VDD top metal mesh is connected to top-1 metal connector line by a VIA (e.g. connector 421). In the discussion here, the connector 418 may refer to a one connector and/or a one group of similar connectors, and the connector 421 may refer to a single connector and/or a one group of similar connectors. Also, connector line may refer to one connector line and/or one group of similar connector lines.

In the layout 470, a resistance due to two VIAs is encountered in the path providing connectivity between the two VDD meshes. The VIA resistance is a significant component of the power mesh resistance. As such, two VIAs associated with every break point contributes to an increased resistance in the power bus. For the scenario of multiple break points in the power mesh, the resistance will be even higher. The increased power mesh resistance degrades the frequency of operation and increases the active power of the semiconductor device. Furthermore, the need for reduced power mesh resistance has become important to allow scaling down of supply voltage in the semiconductor devices.

Figure 5:
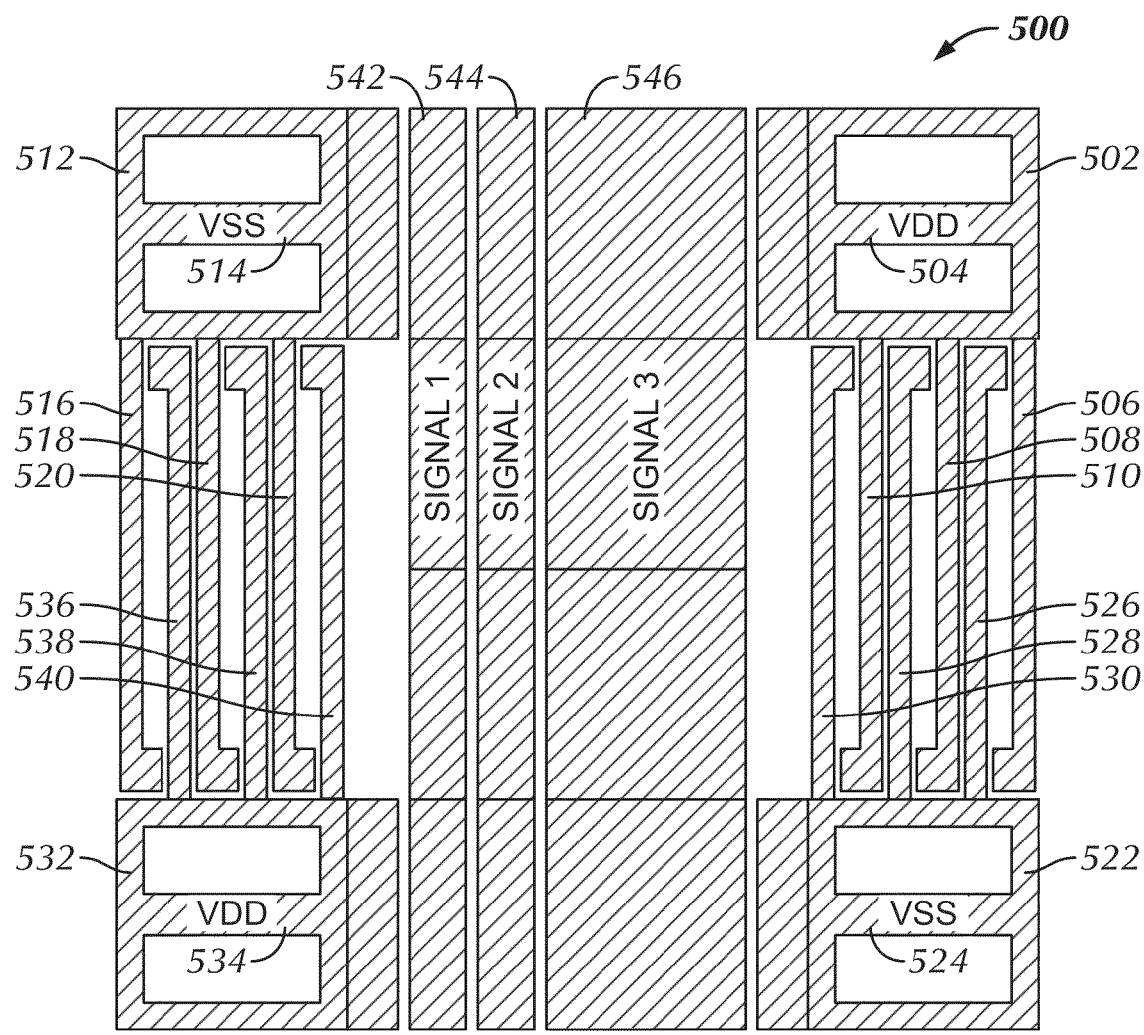
FIGS. 5, 6, and 7 show the layout of zipper structure in accordance with one or more embodiments of the present invention.
Figure 6:
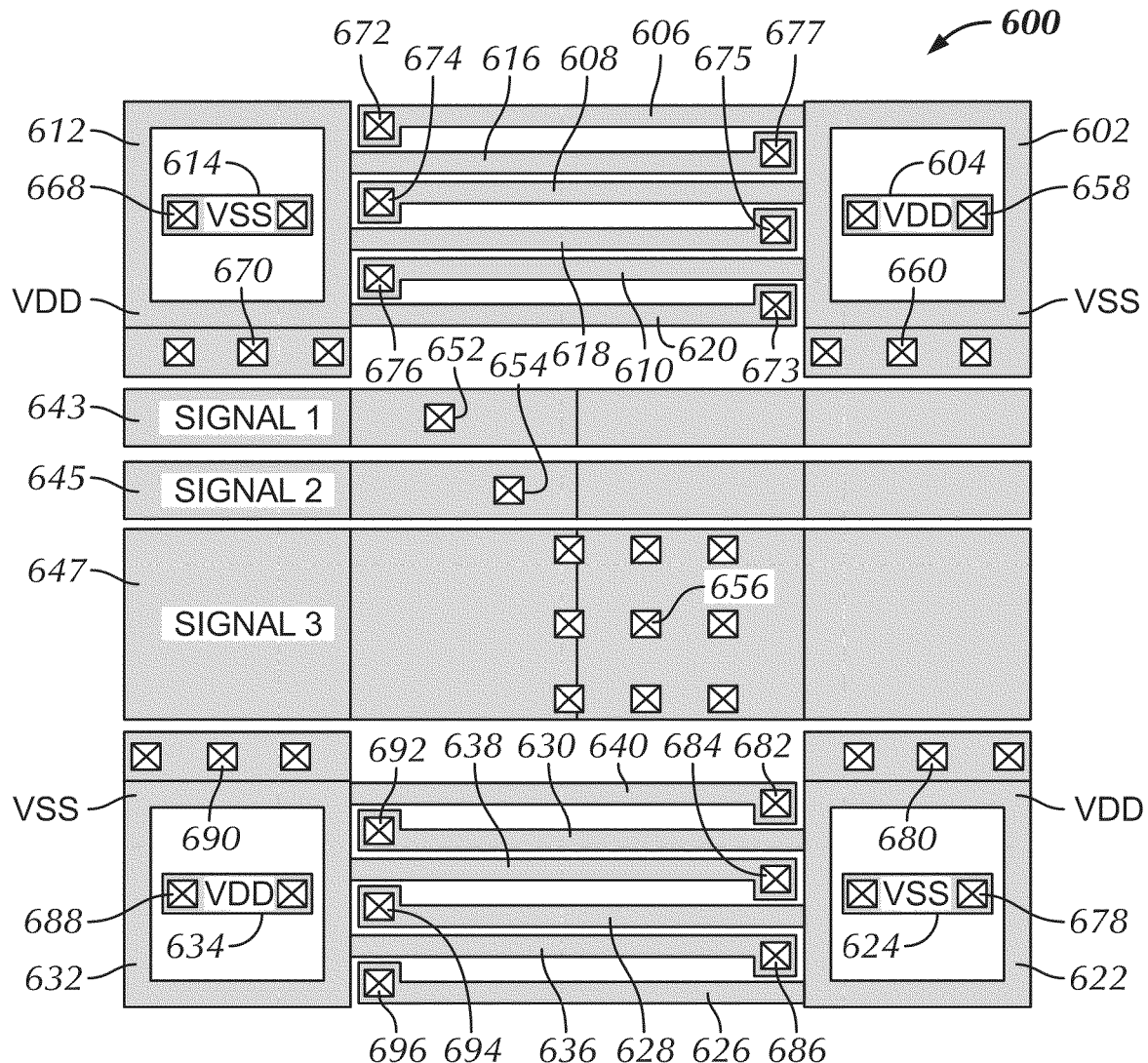
Figure 7:
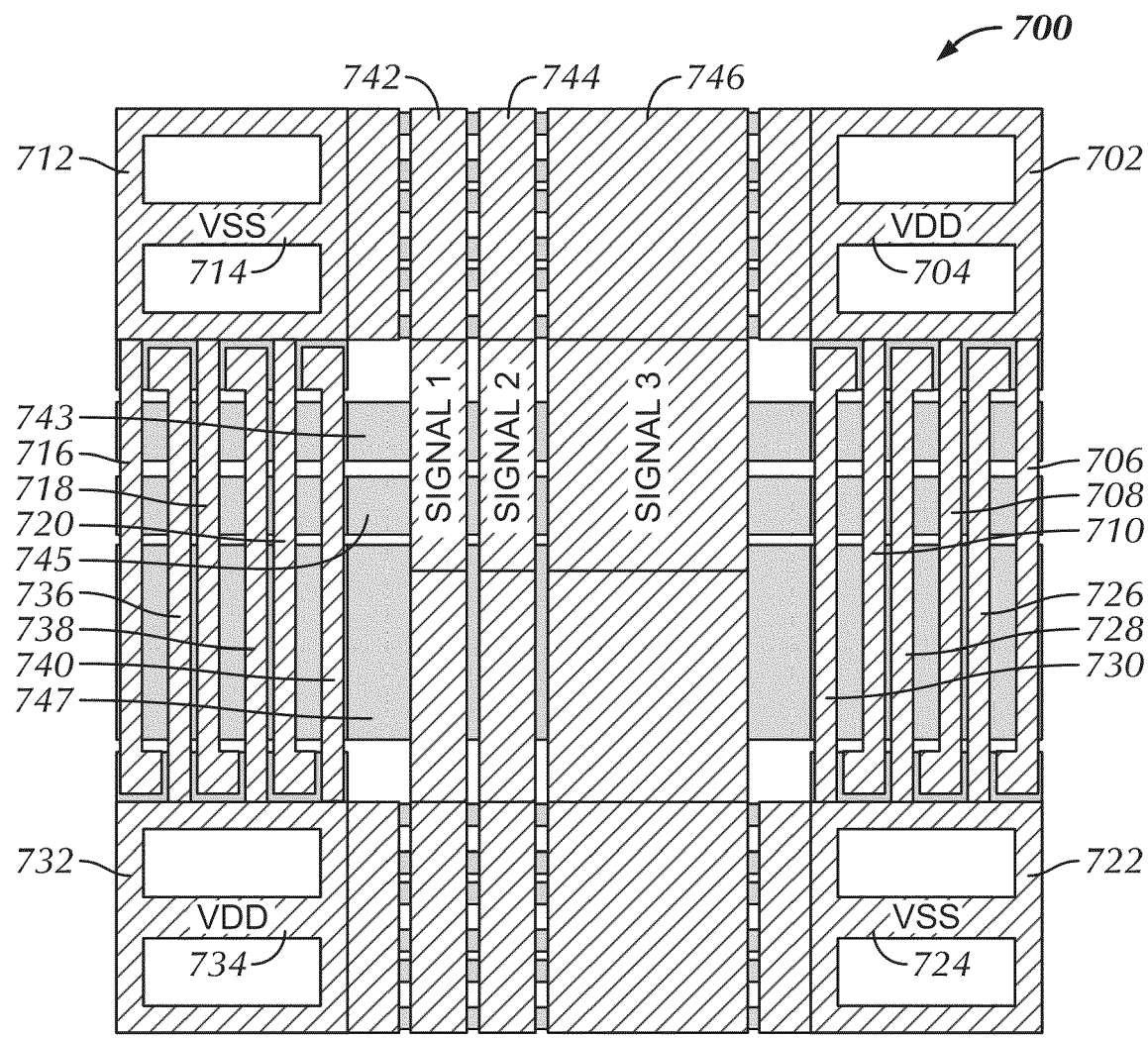

The FIGS. 5, 6, and 7 show the layout of a zipper structure in accordance with one or more embodiments of the present invention. The VDD power bus/mesh and VSS power bus/mesh are in both metal layers, i.e., top metal and top-1 metal. In other words, the VDD power bus/mesh is not restricted to top metal and VSS power bus/mesh is not restricted to top-1 metal. There are many benefits to employing this approach, along with the zipper structure, as is discussed below.

The FIG. 5 shows the layout 500 of a zipper structure, in the top metal layer, in accordance with one or more embodiments of the present invention. The zipper layout 500 illustrates three signal lines, i.e. SIGNAL 1 542, SIGNAL 2 544, and SIGNAL 3 546 running vertically in top metal layer. The zipper layout 500 includes a recessed-square structure 502 with horizontal bar structure 504, both VDD top metal, connected to vertical top metal connector lines 506, 508, and 510. The zipper layout 500 includes a recessed-square structure 512 with horizontal bar structure 514, both VSS top metal, connected to vertical top metal connector lines 516, 518, and 520. The zipper layout 500 includes a recessed-square structure 522 with horizontal bar structure 524, both VSS top metal, connected to vertical top metal connector lines 526, 528, and 530. The zipper layout 500 includes a recessed-square structure 532 with horizontal bar structure 534, both VDD top metal, connected to vertical top metal connector lines 536, 538, and 540.

FIG. 6 shows the layout 600 of a zipper structure, in the top-1 metal layer, in accordance with one or more embodiments of the present invention. The SIGNAL 1 643 in top-1 metal is connected to top metal SIGNAL 1 542 in zipper layout 500 by VIA 652. The SIGNAL 2 645 in top-1 metal is connected to top metal SIGNAL 2 544 in zipper layout 500 by VIA 654. The SIGNAL 3 647 in top-1 metal is connected to top metal SIGNAL 3 546 in zipper layout 500 by a group of VIA 656. This way, the three signal lines (SIGNAL 1, SIGNAL 2, and SIGNAL 3) are running vertically in top metal, and running horizontally in top-1 metal.

The zipper layout 600 includes a VSS top-1 metal recessed-square structure 602 connected to horizontal top-1 metal connector lines 606, 608, and 610. The top-1 metal connector lines 606, 608, and 610 are connected by corresponding VIAs 672, 674, and 676 to VSS top metal recessed-square structure 512 in zipper layout 500. The zipper layout 600 includes a VDD top-1 metal recessed-square structure 612 connected to horizontal top-1 metal connector lines 616, 618, and 620. The top-1 metal connector lines 616, 618, and 620 are connected by corresponding VIAs 673, 675, and 677 to VDD top metal recessed-square structure 502 in zipper layout 500.

The zipper layout 600 includes a VDD top-1 metal recessed-square structure 622 connected to horizontal top-1 metal connector lines 626, 628, and 630. The top-1 metal connector lines 626, 628, and 630 are connected by corresponding VIAs 692, 694, and 696 to VDD top metal recessed-square structure 532 in zipper layout 500. The VDD top-1 metal recessed-square structure 622 includes a VIA 678 and a metal connector line 624. Similarly, the VDD top-1 metal recessed-square structure 668 includes a VIA 668 and a metal connector line 614. The zipper layout 600 includes a VSS top-1 metal recessed-square structure 632 connected to horizontal top-1 metal connector lines 636, 638, and 640. The top-1 metal connector lines 636, 638, and 640 are connected by corresponding VIAs 682, 684, and 686 to VSS top metal recessed-square structure 522 in zipper layout 500. The VSS top-1 metal recessed-square structure 602 includes a VIA 658 and a metal connector line 604. Similarly, the VSS top-1 metal recessed-square structure 632 includes a VIA 688 and a metal connector line 634.

The VSS recessed-square structure 602 is connected by VIA 660 to vertical top metal connector line 528 in zipper layout 500. Similarly, the VSS recessed-square structure 602 is connected to vertical top metal connector lines 526 and 530. In the zipper layout 500, the vertical top metal connector lines 526, 528, and 530 are connected to VSS top metal recessed-square structure 522. The VDD recessed-square structure 612 is connected by VIA 670 to vertical top metal connector line 538 in zipper layout 500. Similarly the VDD recessed-square structure 612 is connected to top metal connector lines 536 and 540. In the zipper layout 500, the top metal connector lines 536, 538, and 540 are connected to VDD top metal recessed-square structure 532.

The VDD recessed-square structure 622 is connected by VIA 680 to vertical top metal connector line 508 in zipper layout 500. Similarly, the VDD recessed-square structure 622 is connected to vertical top metal connector lines 506 and 510. In the zipper layout 500, the vertical top metal connector lines 506, 508, and 510 are connected to VDD top metal recessed square structure 502. The VSS recessed-square structure 632 is connected by VIA 690 to vertical top metal connector line 518 in zipper layout 500. Similarly, the VSS recessed-square structure 632 is connected to top metal connector lines 516 and 520. In the zipper layout 500, the top metal connector lines 516, 518, and 520 are connected to VSS top metal recessed square structure 512.

FIG. 7 shows the layout 700 of a zipper structure, created by placing top metal zipper layout 500 directly above the top-1 metal zipper layout 600, in accordance with one or more embodiments of the present invention. The zipper layout 700 shows SIGNAL 1 742, SIGNAL 2 744, and SIGNAL 3 746 running vertically in top metal layer. The SIGNAL 1 743, SIGNAL 2 745, and SIGNAL 3 747 running horizontally in top-1 metal are only visible wherever there is no top metal above the top-1 metal signals. The signal lines running vertically in top metal and the signal lines running horizontally in top-1 metal are connected by respective VIAs. The zipper layout 700 also shows VDD recessed-squares structure 702, VSS recessed-squares structure 712, VSS recessed-squares structure 722, and VDD recessed-squares structure 732. Additionally, the zipper layout shows the corresponding vertical top metal connector lines from the top metal layer 706, 708, 710, 716, 718. 720, 726, 728, 730, 736, 738, and 740. Further, the zipper layour 700 shows the corresponding horizontal bar structures 704, 714, 724, 734 from the top metal layer. In the zipper layout 700, all of the recessed-square structures are also connected to corresponding horizontal bar structures and vertical connector lines, shown in the top metal layer.

It will be apparent based on preceding discussion for zipper layouts 500, 600, and 700 that each break point in power bus/mesh is associated with a single VIA. In the discussion here, single VIA may refer to a single VIA and/or a single group of similar VIAs, e.g., a group of VIAs to connect top metal to top-1 metal, or a group of VIAs to connect top-1 metal to top metal. The VIA resistance is a significant component of the power bus/mesh resistance. As such, a single VIA associated with each break point in zipper layouts 500, 600, and 700 contributes to a lower power bus/mesh resistance as compared to two VIAs for each break point.

The single VIA for each breakpoint has been possible, in part, due to a layout methodology such that each of the VDD power bus/mesh and VSS power bus/mesh are in both metal layers, i.e., top metal and top-1 metal. In other words, the VDD power bus/mesh is not restricted only to top metal and the VSS power bus/mesh is not restricted only to top-1 metal. As an example of the zipper layout, the VDD top metal recessed-square 502 in the zipper layout 500 is connected to the VDD top-1 metal recessed-square 612 in the zipper layout 600. The VDD top metal recessed-square 502 in the zipper layout 500 may be a part of a VDD power full-dense-mesh (FDM) in top metal, and the VDD top-1 metal recessed square 612 in the zipper layout 600 may be a part of another VDD power FDM in top-1 metal. The two VDD power FDM are connected by a single VIA (or, a single group of similar VIAs) provided by VIAs 673, 675, and 677 along with top-1 metal connector lines 616, 618, and 620 in the zipper layout 600. As such, there may be only a single VIA (or, a single group of similar VIAs) in the path of power bus/mesh due to a break point caused by vertical signals lines (e.g., SIGNAL 1 742, SIGNAL 2 744, and SIGNAL 3 746 in top metal layer in the zipper layout 700).

In another example of the zipper layout, the VDD top metal recessed-square 502 in the zipper layout 500 is connected to the VDD top-1 metal recessed square 622 in the zipper layout 600. The VDD top metal recessed-square 502 in the zipper layout 500 may be a part of a VDD power FDM in top metal, and the VDD top-1 metal recessed square 622 in the zipper layout 600 may be a part of a VDD power FDM in top-1 metal. The two VDD power FDM may be connected by a single VIA 680 (or, a single group of similar VIAs) in the zipper layout 600 along with top metal connector lines 506, 508, and 510 in the zipper layout 500. As such, there may be only a single VIA (or, a single group of similar VIAs) in the path of power bus/mesh due to a break point caused by horizontal signals lines (e.g., SIGNAL 1 743, SIGNAL 2 745, and SIGNAL 3 747 in top-1 metal layer in the zipper layout 700).

Based upon the preceding discussion, the zipper structure(s) illustrated in layouts 500, 600, and 700 encounters only a single VIA (or, a single group of similar VIAs) at a power bus/mesh breakpoint caused by the signal line(s). Also, the resistance encountered by VDD power mesh and VSS power mesh is balanced (i.e., similar) because each of the VDD and VSS power mesh may be in both the metal layers, i.e., the top metal layer and the top-1 metal layer. The reduction in VIA(s), e.g. from two to one, at a breakpoint of zipper structure leads to reduced power bus/mesh resistance. The reduced power bus/mesh resistance offers multiple benefits, e.g., lower operating power, higher frequency of operation, and reduced VDD of operation.

Figure 8:
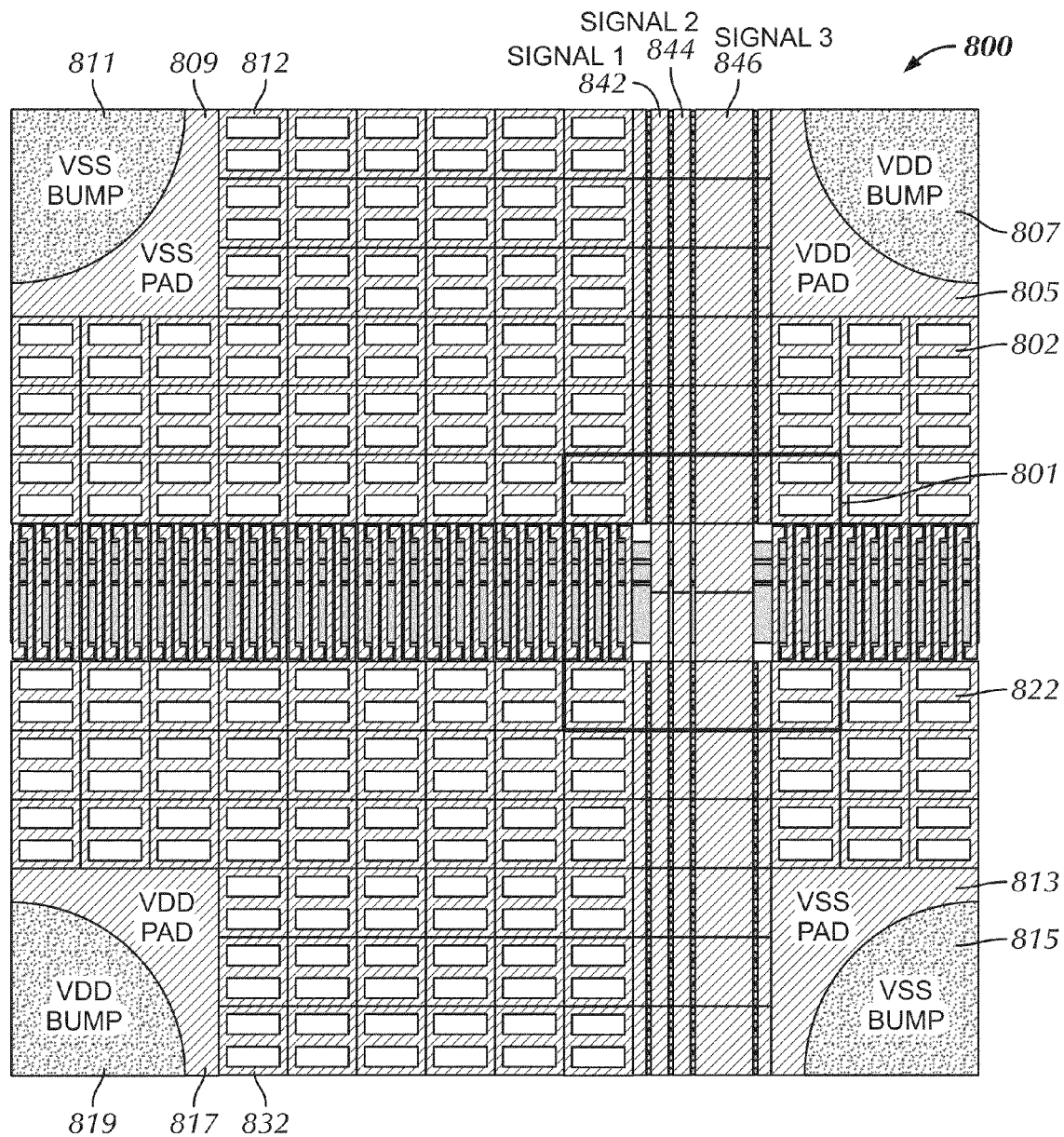
FIGS. 8, 9 and 10 show the layout of zipper, pad, bump, and mesh structure in accordance with one or more embodiments of the present invention.

FIG. 8 shows the layout 800 of zipper, pad, bump, and mesh structure, in accordance with one or more embodiments of the present invention. The layout 800 is zoomed out version of the layout 700. The box 801 in layout 800 illustrates the layout 700 in FIG. 7. Based on preceding discussion, SIGNAL 1 842, SIGNAL 2 844, and SIGNAL 3 846 are running vertically in top metal layer. The corresponding SIGNAL 1, SIGNAL 2, and SIGNAL 3 lines are running horizontally (not shown) in top-1 metal layer in middle of the layout 800 through the box 801.

The VDD power FDM in top metal, replicated with recessed-square structures such as 802, is seamlessly connected to VDD pad 805 and VDD bump 807. The VSS power FDM in top metal, replicated with recessed-square structures such as 812, is seamlessly connected to VSS pad 809 and VSS bump 811. The VSS power FDM in top metal, replicated with recessed-square structures such as 822, is connected to VSS pad 813 and VSS bump 815. The VDD power FDM in top metal, replicated with recessed-square structures such as 832, is connected to VDD pad 817 and VDD bump 819.

While the layout 800 includes both top metal and top-1 metal layers, the view of top-1 metal layer is mostly obscured due to the top metal directly above it. VDD power FDM in top metal, connected to VDD pad 805, encounters a discontinuity towards the left side due to SIGNAL 1 842, SIGNAL 2 844, and SIGNAL 3 846 lines running vertically. With the help of zipper structure (not shown), the VDD power FDM in top metal, connected to the VDD pad 805, continues as the VDD power FDM in top-1 metal directly below a VSS power FDM. The VSS power FDM is in top metal and created by replicating 812.

Similarly, the VDD power FDM in top metal, connected to VDD pad 805, encounters a discontinuity on the lower side due to SIGNAL 1, SIGNAL 2, and SIGNAL 3 lines running horizontally in top-1 metal (the view of horizontal signal lines obscured due to top metal directly above the signal lines). With the help of zipper structure (not shown), the VDD power FDM in top metal, connected to the VDD pad 805, continues as the VDD power FDM in top-1 metal directly below a VSS power FDM. The VSS power FDM is in top metal and created by replicating 822.

With the help of zipper structures at discontinuities, i.e., breakpoints, there are VDD power FDM(s) in top-1 metal directly below VSS power FDM(s) in top metal. The VSS power FDM(s) in top metal are created by replicating 812 and 822 respectively. Also, there are VSS power FDM(s) in top-1 metal directly below VDD power FDM(s) in top metal. The VDD power FDM(s) in top metal are created by replicating 802 and 832 respectively.

Figure 9:
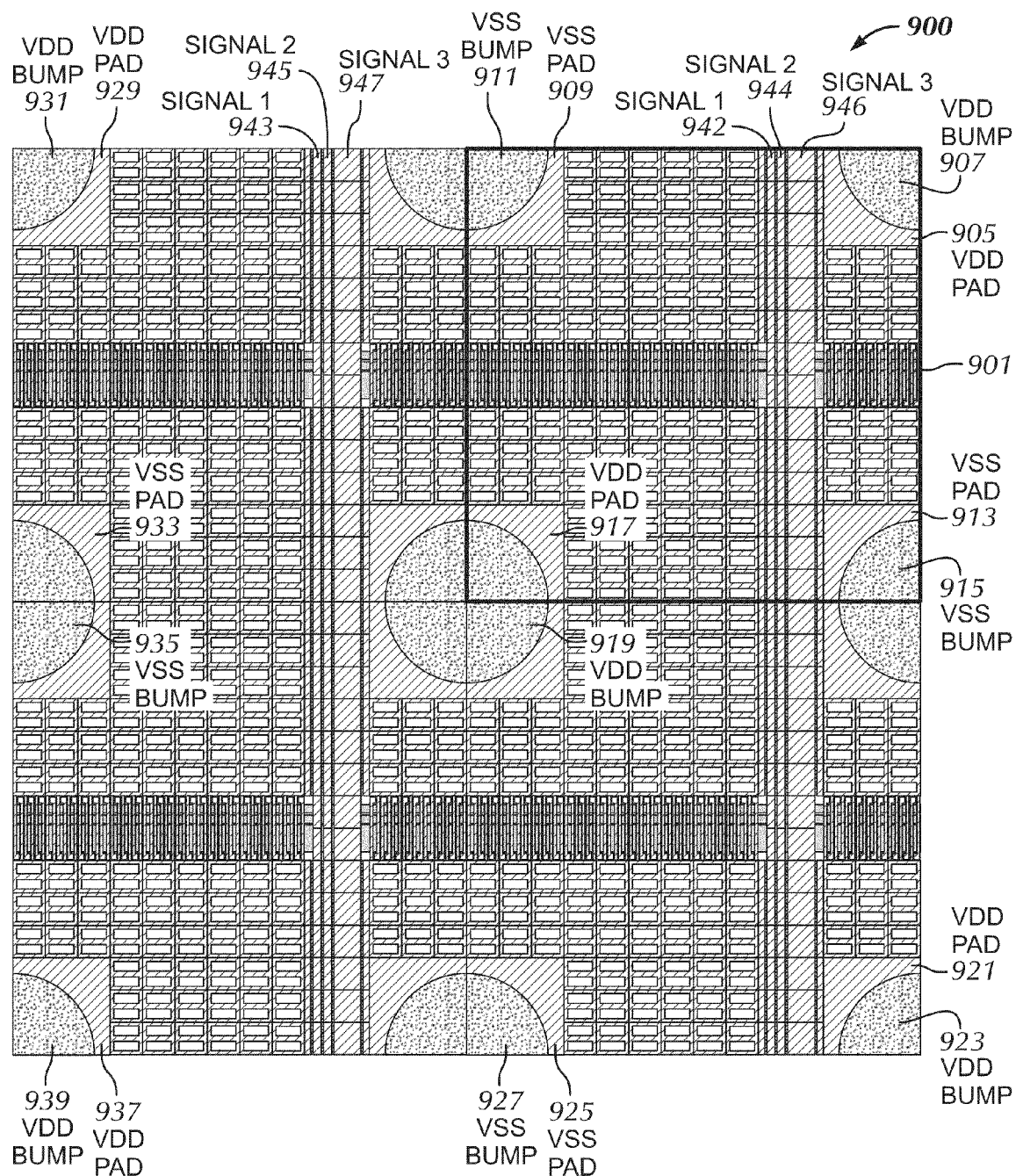

FIG. 9 shows the layout 900 of zipper, pad, bump, and mesh structure, in accordance with one or more embodiments of the present invention. The layout 900 is a zoomed out version of the layout 800. The box 901 in layout 900 illustrates the layout 800 in FIG. 8. There are two sets of signal lines running vertically in top metal, i.e. SIGNAL 1 942, SIGNAL 2 944, and SIGNAL 3 946 and SIGNAL 1 943, SIGNAL 2 945, and SIGNAL 3 947. There are also two sets of SIGNAL 1, SIGNAL 2, and SIGNAL 3 lines running horizontally (the view of horizontal signal lines obscured due to top metal directly above the signal lines).

There are multiple VDD power FDM(s), respectively connected to the following pads and bumps: VDD pad 905 and VDD bump 907, VDD pad 921 and VDD bump 923, VDD pad 917 and VDD bump 919, VDD pad 929 and VDD bump 931, and VDD pad 937 and VDD bump 939. Similarly, there are multiple VSS power FDM(s), respectively connected to the following pads and bumps: VSS pad 913 and VSS bump 915, VSS pad 909 and VSS bump 911, VSS pad 925 and VSS bump 927, and VSS pad 933 and VSS bump 935.

Figure 10:
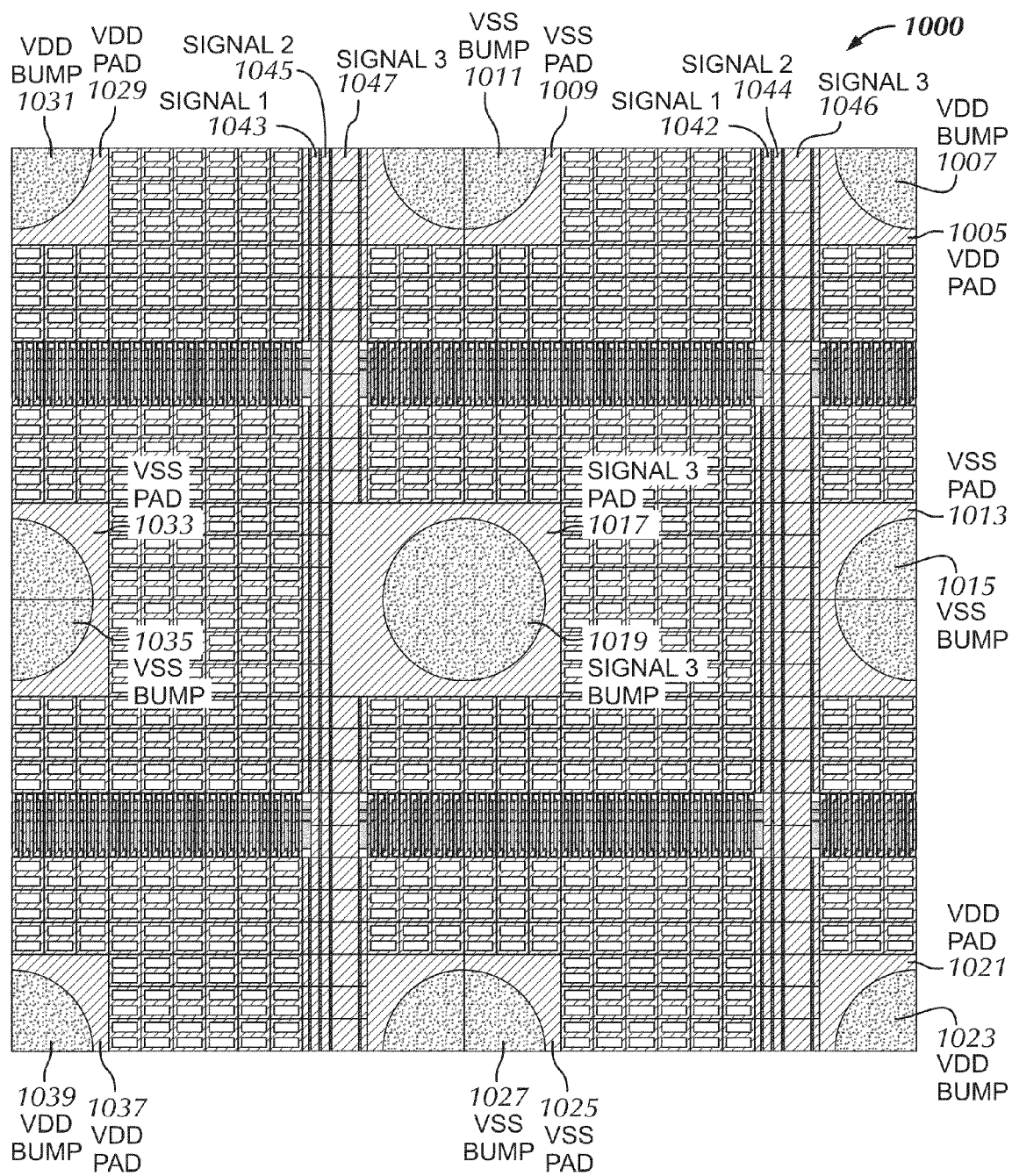

FIG. 10 shows the layout 1000 of zipper, pad, bump, and mesh structure, in accordance with one or more embodiments of the present invention. The layout 1000 is similar to the layout 900, except that the VDD pad 917 and VDD bump 919 in the layout 900 are replaced with the SIGNAL 3 pad 1017 and SIGNAL 3 bump 1019. The SIGNAL 3 pad 1017 in the top metal layer is seamlessly connected to the SIGNAL 3 1047 in the top metal layer. The remaining VDD and VSS pads and bumps in the layout 1000 are similar to the VDD and VSS pads and bumps in the layout 900.

Figure 11:
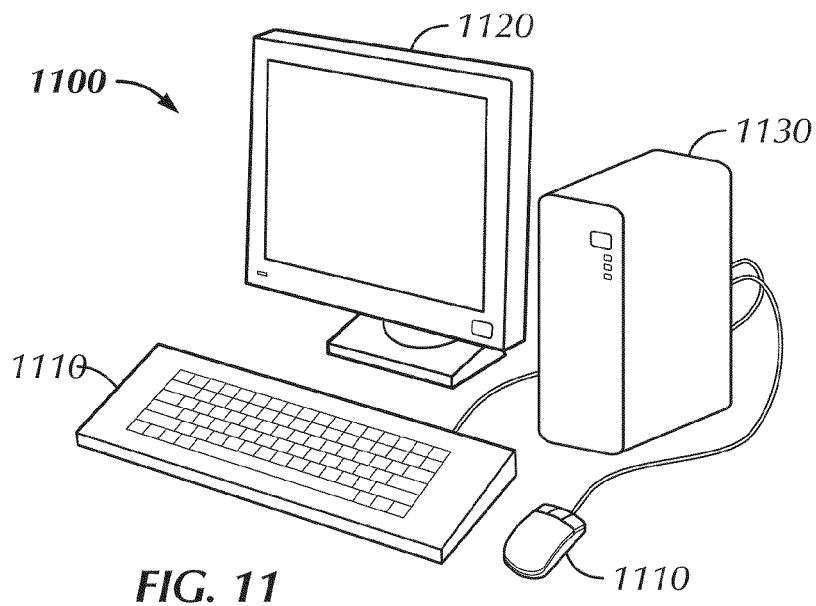
FIG. 11 shows a system in accordance with one or more embodiments of the present invention.

FIG. 11 shows a system in accordance with one or more embodiments of the present invention. A system 1100 includes input devices 1110, an output device 1120, and a mechanical chassis 1130. The mechanical chassis 1130 includes a printed circuit board ("PCB"), a network device, and a storage device (not shown).

Figure 12:
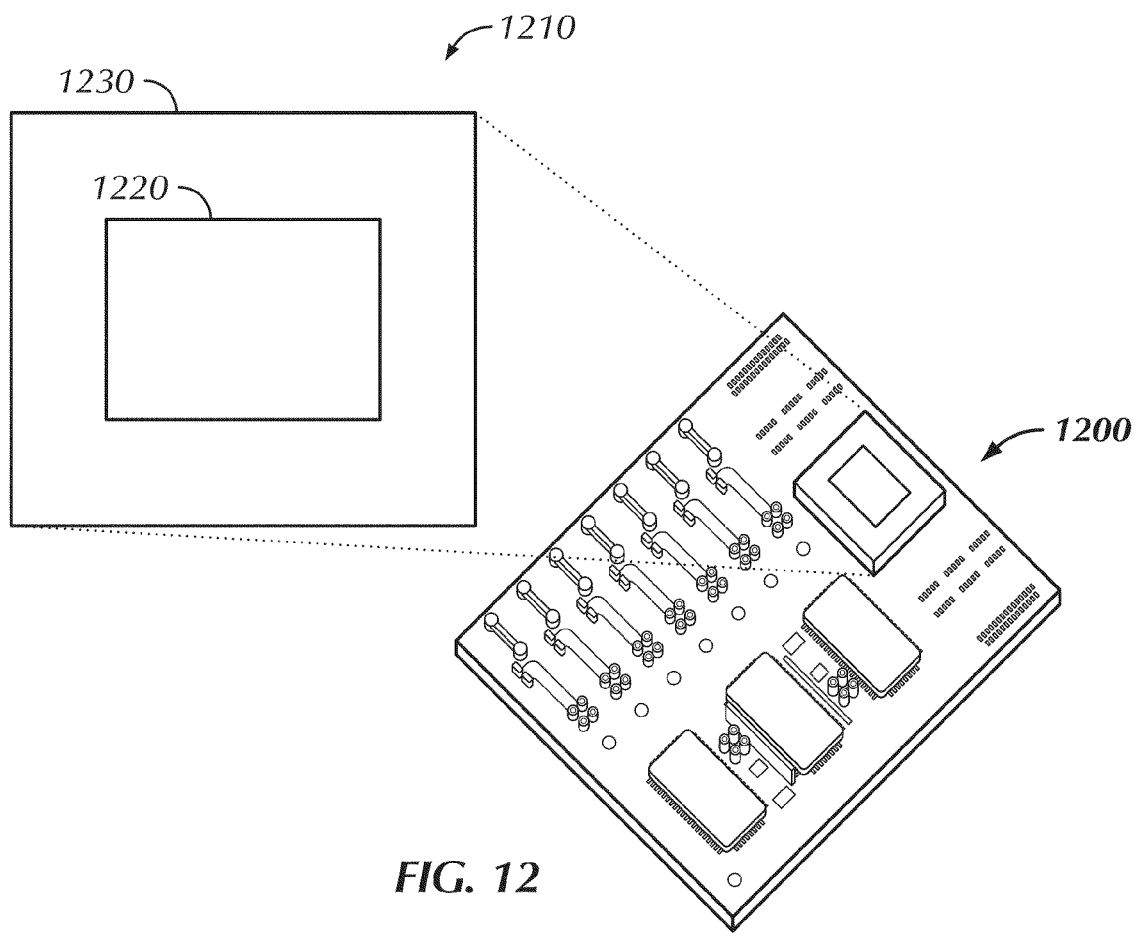
FIG. 12 shows a printed circuit board that includes one or more semiconductor device(s) that each includes one or more semiconductor die in accordance with one or more embodiments of the present invention.

FIG. 12 shows a printed circuit board that includes one or more semiconductor device(s) that each include one or more semiconductor die in accordance with one or more embodiments of the present invention. The PCB 1200 may be included in system 1100 of FIG. 11 and includes one or more semiconductor device(s) 1210. Each semiconductor device 1210 includes one or more semiconductor die 1220 encapsulated in a mechanical package 1230. The mechanical package 1230 serves as an electrical and mechanical interface between the die 1220 and the PCB 1200.

The PCB 1200 provides one or more external signals to the semiconductor device 1210. The mechanical package 1230 provides the external signal(s) to the die 1220. The die 1220 is comprised of a plurality of metal layers and a semiconductor layer. The die 1220 generates one or more internal signals that are a function of the provided external signal(s). The die 1220 may include a plurality of zipper structures at discontinuities, i.e., breakpoints, encountered in the path of power bus/mesh due to signal line(s).

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A zipper structure for power distribution in a semiconductor device, comprising:
   a first contiguous full-dense-mesh (FDM) array of a first supply in a top metal layer of a plurality of metal layers;
   a second contiguous FDM array of a second supply in a top-1 metal layer of the plurality of metal layers, wherein a portion of the first contiguous FDM array and a portion of the second contiguous FDM array overlap;
   a third contiguous FDM array of the second supply in the top metal layer;
   a fourth contiguous FDM array of the first supply in the top-1 metal layer, wherein a portion of the third contiguous FDM array and a portion of the fourth contiguous FDM array overlap; and
   a signal line,
   wherein the first contiguous FDM array is connected to the fourth contiguous FDM array by a first plurality of vias and a first plurality of connector lines in a recessed-square structure,
   wherein the second contiguous FDM array is connected to the third contiguous FDM array by a second plurality of vias and a second plurality of connector lines in a recessed-square structure, and
   wherein a portion of the signal line overlaps with a portion of the first plurality of connector lines and with a portion of the second plurality of connector lines.

2. The zipper structure of claim 1,
   wherein the signal line is in the top metal layer,
   wherein the first plurality of connector lines is in the top-1 metal layer, and
   wherein the second plurality of connector lines is in the top-1 metal layer.

3. The zipper structure of claim 1,
   wherein the signal line is in the top-1 metal layer,
   wherein the first plurality of connector lines is in the top metal layer, and
   wherein the second plurality of connector lines is in the top metal layer.

4. The zipper structure of claim 1,
   wherein the first contiguous FDM array comprises a first pad in the top metal.

5. The zipper structure of claim 1,
   wherein the third contiguous FDM array comprises a second pad in the top metal.

6. The zipper structure of claim 1,
   wherein the signal line is in the top metal layer, and
   wherein the signal line is connected to a signal pad in the top metal layer.

7. The zipper structure of claim 4,
   wherein the first pad in the top metal is connected to a first bump.

8. The zipper structure of claim 5,
   wherein the second pad in the top metal is connected to a second bump.

9. A semiconductor device comprising:
   a mechanical package; and
   a semiconductor die comprising:
   a semiconductor layer,
   a plurality of metal layers, and
   a zipper structure comprising:
   a first contiguous full-dense-mesh (FDM) array of a first supply in a top metal layer of the plurality of metal layers;
   a second contiguous FDM array of a second supply in a top-1 metal layer of the plurality of metal layers, wherein a portion of the first contiguous FDM array and a portion of the second contiguous FDM array overlap;
   a third contiguous FDM array of the second supply in the top metal layer;
   a fourth contiguous FDM array of the first supply in the top-1 metal layer, wherein a portion of the third contiguous FDM array and a portion of the fourth contiguous FDM array overlap; and
   a signal line,
   wherein the first contiguous FDM array is connected to the fourth contiguous FDM array by a first plurality of vias and a first plurality of connector lines in a recessed-square structure,
   wherein the second contiguous FDM array is connected to the third contiguous FDM array by a second plurality of vias and a second plurality of connector lines in a recessed-square structure, and
   wherein a portion of the signal line overlaps with a portion of the first plurality of connector lines and with a portion of the second plurality of connector lines.

10. The semiconductor device of claim 9,
    wherein the signal line is in the top metal layer,
    wherein the first plurality of connector lines is in the top-1 metal layer, and wherein the second plurality of connector lines is in the top-1 metal layer.

11. The semiconductor device of claim 9, wherein the signal line is in the top-1 metal layer, wherein the first plurality of connector lines is in the top metal layer, and wherein the second plurality of connector lines is in the top metal layer.

12. The semiconductor device of claim 9, wherein the first contiguous FDM array comprises a first pad in the top metal.

13. The semiconductor device of claim 9, wherein the third contiguous FDM array comprises a second pad in the top metal.

14. The semiconductor device of claim 9, wherein the signal line is in the top metal layer, and wherein the signal line is connected to a signal pad in the top metal layer.

15. A system comprising:
an input device;
an output device;
a mechanical chassis;
a printed circuit board; and
a semiconductor device comprising:
a mechanical package, and
a semiconductor die comprising:
a semiconductor layer,
a plurality of metal layers, and
a zipper structure comprising:
a first contiguous full-dense-mesh (FDM) array of a first supply in a top metal layer of the plurality of metal layers;
a second contiguous FDM array of a second supply in a top-1 metal layer of the plurality of metal layers, wherein a portion of the first contiguous FDM array and a portion of the second contiguous FDM array overlap;
a third contiguous FDM array of the second supply in the top metal layer;
a fourth contiguous FDM array of the first supply in the top-1 metal layer, wherein a portion of the third contiguous FDM array and a portion of the fourth contiguous FDM array overlap; and
a signal line,
wherein the first contiguous FDM array is connected to the fourth contiguous FDM array by a first plurality of vias and a first plurality of connector lines in a recessed-square structure,
wherein the second contiguous FDM array is connected to the third contiguous FDM array by a second plurality of vias and a second plurality of connector lines in a recessed-square structure, and
wherein a portion of the signal line overlaps with a portion of the first plurality of connector lines and with a portion of the second plurality of connector lines.

16. The system of claim 15, wherein the signal line is in the top metal layer, wherein the first plurality of connector lines is in the top-1 metal layer, and wherein the second plurality of connector lines is in the top-1 metal layer.

17. The system of claim 15, wherein the signal line is in the top-1 metal layer, wherein the first plurality of connector lines is in the top metal layer, and wherein the second plurality of connector lines is in the top metal layer.

18. The system of claim 15, wherein the first contiguous FDM array comprises a first pad in the top metal.

19. The system of claim 15, wherein the third contiguous FDM array comprises a second pad in the top metal.

20. The system of claim 15, wherein the signal line is in the top metal layer, and wherein the signal line is connected to a signal pad in the top metal layer.

* * * * *